(12) United States Patent
Mainville et al.

(10) Patent No.: US 8,287,285 B2
(45) Date of Patent: Oct. 16, 2012

(54) SYSTEM AND METHOD FOR REDUCING ELECTROMAGNETIC INTERFERENCE FROM A CONDUCTIVE INTERIOR TRIM COMPONENT

(75) Inventors: Steven M. Mainville, Holland, MI (US); Sreeniwas Ranganathan, Holland, MI (US); Bryan Shafer, Holland, MI (US); Scott W. Mee, Holland, MI (US)

(73) Assignee: Johnson Controls Technology Company, Holland, MI (US)

( * ) Notice: Subject to any disclaimer, the term of this patent is extended or adjusted under 35 U.S.C. 154(b) by 190 days.

(21) Appl. No.: 12/910,050

(22) Filed: Oct. 22, 2010

(65) Prior Publication Data

US 2012/0098288 A1  Apr. 26, 2012

(51) Int. Cl.
*B60R 13/02* (2006.01)

(52) U.S. Cl. ............. 439/34; 439/92; 296/70; 296/39.1; 296/1.08

(58) Field of Classification Search ............... 296/70, 296/39.1, 1.08; 439/34, 92
See application file for complete search history.

(56) References Cited

U.S. PATENT DOCUMENTS

| 4,798,658 | A | * | 1/1989 | Herzog et al. | 204/196.05 |
| 5,484,186 | A | * | 1/1996 | Van Order et al. | 296/97.5 |
| 5,629,712 | A | * | 5/1997 | Adrian et al. | 343/713 |
| 6,756,945 | B2 | * | 6/2004 | Mizutani | 343/713 |
| 7,258,555 | B2 | * | 8/2007 | Tiesler et al. | 439/121 |
| 2008/0049949 | A1 | * | 2/2008 | Snider et al. | 381/86 |
| 2010/0246155 | A1 | * | 9/2010 | Snider et al. | 361/818 |

* cited by examiner

*Primary Examiner* — Gary F. Paumen
(74) *Attorney, Agent, or Firm* — Fletcher Yoder P.C.

(57) ABSTRACT

A vehicle interior assembly includes an electronic sub-assembly and a conductive interior trim component at least partially disposed about the electronic sub-assembly. The conductive interior trim component is electrically coupled to a conductive structure at a reference potential.

20 Claims, 5 Drawing Sheets

SYSTEM AND METHOD FOR REDUCING ELECTROMAGNETIC INTERFERENCE FROM A CONDUCTIVE INTERIOR TRIM COMPONENT

BACKGROUND

The invention relates generally to conductive trim components within a vehicle interior, and more specifically, to a system and method for reducing electromagnetic interference exacerbated by a conductive interior trim component.

A variety of decorative interior trim components may be employed throughout an interior of a vehicle. For example, certain instrument panels (e.g., instrument gauge cluster modules, driver information electronic sub-assemblies, etc.) may include decorative rings disposed about individual gauges, groups of gauges and/or the perimeter of the instrument panel. Other instrument panels may include a graphical display having a decorative trim component disposed about the border of the display. Furthermore, additional displays and/or gauges may be located within other areas of the vehicle interior, such as the center console and/or the headrest of a seat, for example. Such displays and/or gauges may also include a decorative trim component disposed about their perimeters.

Certain decorative trim components include various conductive elements. For example, the trim component may be constructed from a solid piece of metal, such as aluminum, stainless steel or brass. In addition, the trim component may be coated with a thin layer of metal, such as chrome, nickel, copper, etc., to enhance the visual appeal of the trim component. Further trim components may include a plastic base material coated with a metallic layer, such as chrome, nickel, or copper, for example. Other decorative trim components may include alternative conductive materials such as a conductive polymer, for example.

Unfortunately, the inventors have found that such conductive interior trim components may reradiate electromagnetic energy, thereby interfering with various electrical components within the vehicle. For example, a conductive interior trim component may be disposed about the perimeter of a graphical display within the instrument panel. Radiated emissions, such as near field or far field radio frequency (RF) emissions, produced by another electrical component within the vehicle (e.g., switched-mode power supply, microprocessor, radio transmitter, etc.) may be absorbed and reradiated by the conductive interior trim component. As a result, the reradiated signal may generate electromagnetic interference within a graphics interface that provides a graphical signal to the display. Consequently, an image on the display may become distorted or have an otherwise undesirable appearance. Conversely, the conductive interior trim component disposed about the display may reradiate electromagnetic energy produced by the display and/or by the graphics processor which drives the display. As a result, electromagnetic interference may be induced within other vehicle electrical components, such as sensors, radios, etc., thereby potentially disrupting the performance of the electrical components.

BRIEF DESCRIPTION OF THE INVENTION

The present invention relates to a vehicle interior assembly including an electronic sub-assembly and a conductive interior trim component at least partially disposed about the electronic sub-assembly. The conductive interior trim component is electrically coupled to a conductive structure at a reference potential.

The present invention also relates to a vehicle interior assembly including an electronic sub-assembly and a conductive interior trim component at least partially disposed about the electronic sub-assembly. The vehicle interior assembly also includes an electrical coupling extending between the conductive interior trim component and a conductive structure at a reference potential.

The present invention further relates to a method for reducing electromagnetic interference from a conductive interior trim component. The method includes disposing the conductive interior trim component at least partially about an electronic sub-assembly within a vehicle interior assembly. The method further includes electrically coupling the conductive interior trim component to a conductive structure at a reference potential.

DRAWINGS

DETAILED DESCRIPTION

Figure 1:
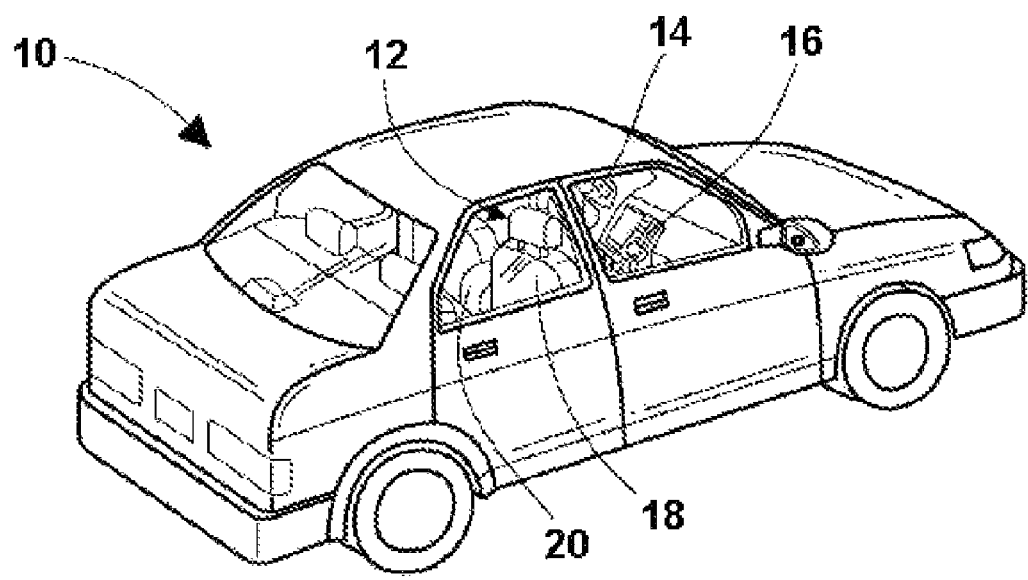
FIG. 1 is a perspective view of an exemplary vehicle that may include a system for reducing electromagnetic interference from a conductive interior trim component.

FIG. 1 is a perspective view of an exemplary vehicle 10 that includes a system for reducing electromagnetic interference from a conductive interior trim component. As illustrated, the vehicle 10 includes an interior 12 having an instrument panel 14 (e.g., instrument gauge cluster module, driver information electronic sub-assembly, etc.), a center console 16, seats 18, and an armrest 20. A variety of decorative interior trim components may be employed throughout the vehicle interior 12. For example, the instrument panel 14 may include decorative rings disposed about individual gauges, groups of gauges and/or the perimeter of the instrument panel 14. Other instrument panels 14 may include a graphical display having a decorative trim component disposed about the border of the display. Furthermore, additional displays and/or gauges may be located within other areas of the vehicle interior, such as the center console 16, the armrest 20 and/or the headrest of the seat 18, for example. Such displays and/or gauges may also include a decorative trim component disposed about their perimeters.

Certain decorative trim components include various conductive elements. For example, the trim component may be constructed from a solid piece of metal, such as aluminum, stainless steel or brass. In addition, the trim component may be coated with a thin layer of metal, such as chrome, nickel, copper, etc., to enhance the visual appeal of the trim component. Further trim components may include a plastic base material coated with a metallic layer, such as chrome, nickel, or copper, for example. Other decorative trim components may include alternative conductive materials such as a conductive polymer, for example.

As discussed in detail below, at least one conductive trim component within the vehicle interior 12 is electrically coupled to a conductive structure at a reference potential. For example, the conductive structure may be a chassis of the vehicle 10. In this configuration, electromagnetic energy absorbed by the conductive interior trim component will be substantially dissipated through the connection to the conductive structure, thereby substantially reducing or eliminating reradiation which may otherwise result in electromagnetic inference with various electrical components within the vehicle 10. For example, a conductive interior trim component may be disposed about the perimeter of a graphical display within the instrument panel 14. Radiated emissions, such as near field or far field radio frequency (RF) emissions, produced by another electrical component within the vehicle 10 (e.g., switched-mode power supply, microprocessor, radio transmitter, etc.) may be absorbed by the conductive interior trim component and dissipated through the electrical connection to the conductive structure. As a result, electromagnetic interference within a graphics interface that provides a graphical signal to the display may be substantially reduced or eliminated. In addition, the conductive interior trim component disposed about the display may absorb and dissipate electromagnetic energy produced by the graphics processor which drives the display, or other source of RF radiation within the electronic sub-assembly. As a result, the possibility of inducing electromagnetic interference within other vehicle electrical components, such as sensors, radios, etc., may be substantially reduced or eliminated.

Figure 2:
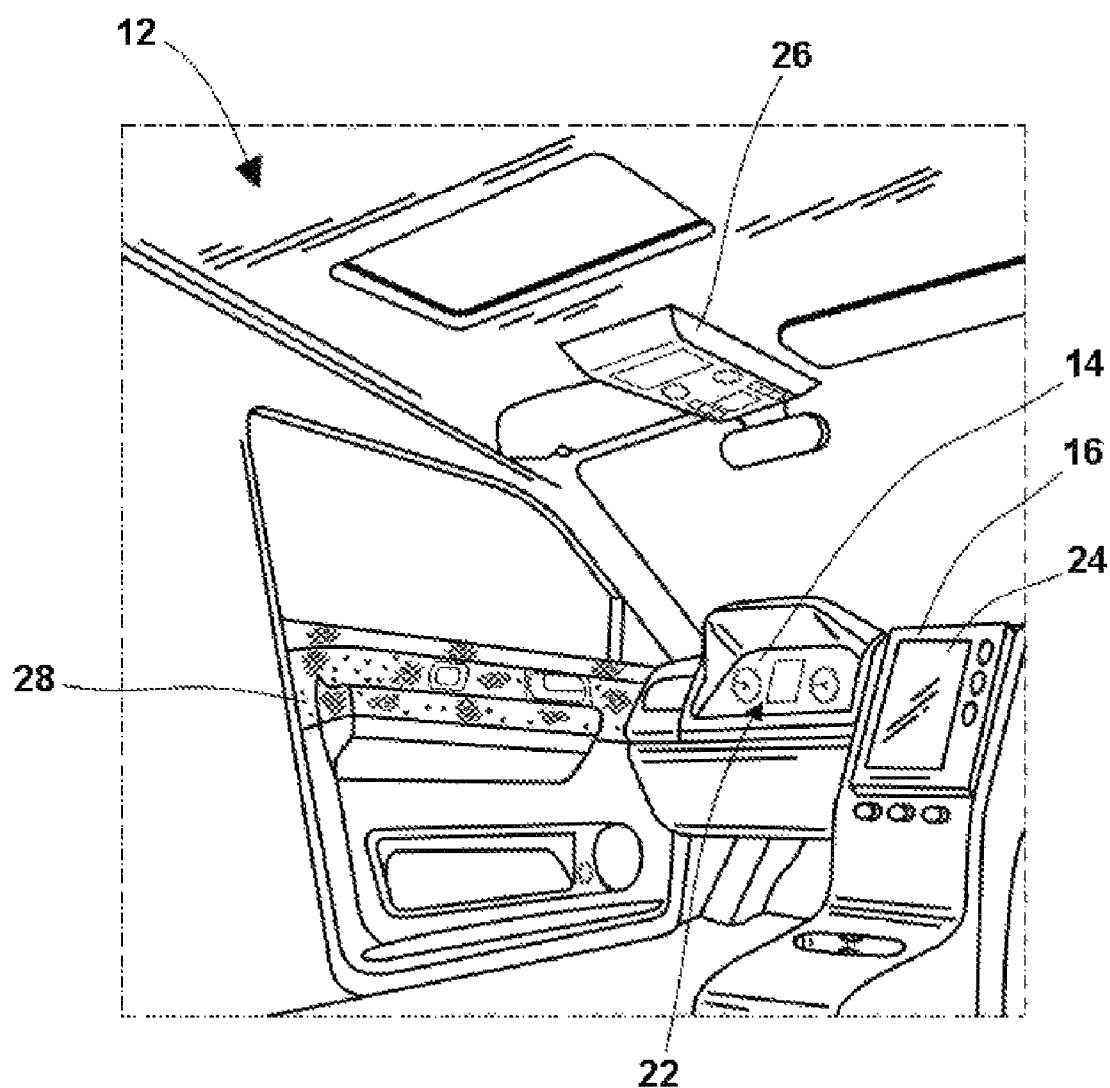
FIG. 2 is a perspective view of a part of the interior of the vehicle of FIG. 1.

FIG. 2 is a perspective view of a part of the interior 12 of the vehicle 10 of FIG. 1. As illustrated, the instrument panel 14 includes a cluster of electronic sub-assemblies 22. As discussed in detail below, the electronic sub-assemblies 22 may include electromechanical gauges and/or graphical displays, for example. Each sub-assembly within the instrument panel 14 may include a conductive interior trim component disposed about the perimeter. In addition, a conductive interior trim component may be disposed about a group of sub-assemblies and/or about the perimeter of the instrument panel 14. At least one conductive trim component within the instrument panel 14 may be electrically coupled to a conductive structure at a reference potential. Consequently, electromagnetic energy absorbed by the conductive interior trim component will be substantially dissipated through the connection to the conductive structure, thereby substantially reducing or eliminating reradiation which may otherwise result in electromagnetic inference with various electrical components within the vehicle 10. In the illustrated embodiment, the center console 16 includes another electronic display 24 which may include a conductive interior trim component disposed about the perimeter of the display 24. Furthermore, an overhead console 26 and/or a door panel 28 may include electronic displays having conductive interior trim components. One or more of these conductive interior trim components may be electrically coupled to the conductive structure at the reference potential to substantially reduce or eliminate reradiation.

Figure 3:
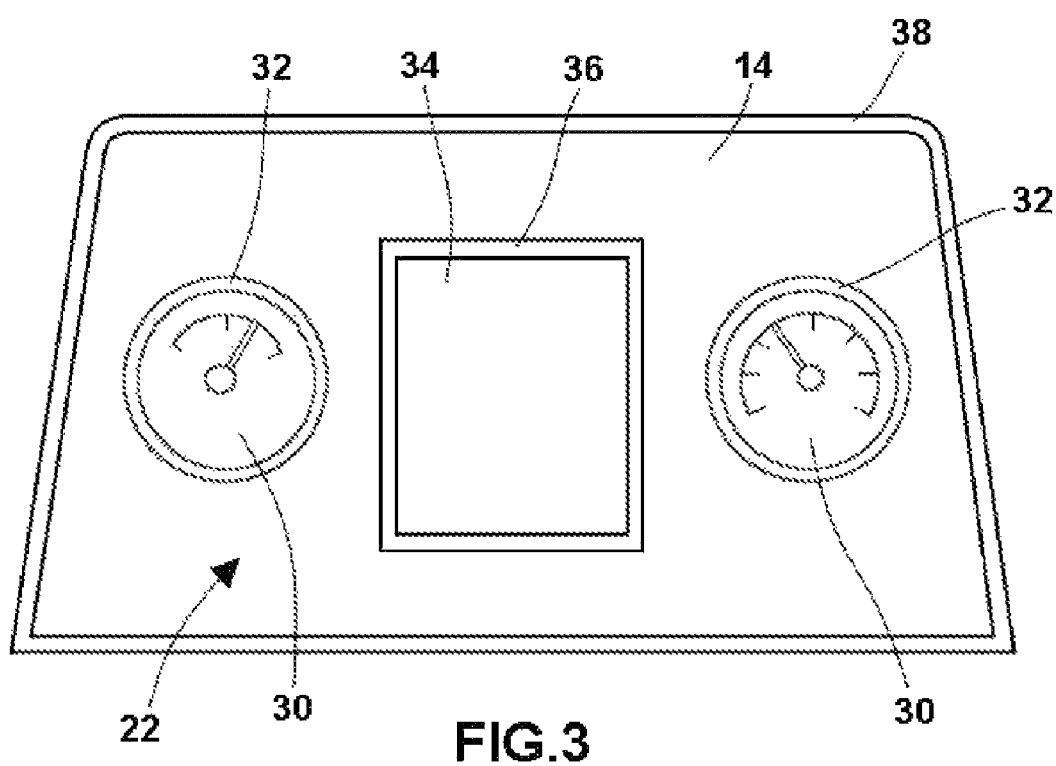
FIG. 3 is a front view of an exemplary instrument panel including multiple conductive interior trim components.

FIG. 3 is a front view of an exemplary instrument panel 14 including multiple conductive interior trim components. In the present embodiment, the instrument panel 14 includes a cluster of electronic sub-assemblies 22, such as the illustrated electromechanical gauges 30. The gauges 30 are configured to receive a signal indicative of a value of a vehicle parameter, and to convey the value to a vehicle operator. For example, the gauges 30 may be configured to display a value indicative of fuel quantity, vehicle speed, coolant temperature, oil temperature, oil pressure, crankshaft rotation rate and/or other parameters associated with operation of the vehicle 10. As illustrated, a conductive interior trim component 32 is disposed about each gauge 30. As previously discussed, the conductive interior trim component 32 may be constructed from a solid piece of metal or a conductive polymer, and/or coated with a thin layer of metal. For example, the conductive interior trim component 32 may form a ring having a metallic exterior surface.

In addition, the cluster of electronic sub-assemblies 22 includes a graphical display 34. In certain embodiments, the graphical display 34 includes a liquid crystal display (LCD), e.g., thin film transistor (TFT) display, configured to present various vehicle parameters and/or navigational information to a vehicle operator. For example, the graphical display 34 may be configured to display numerical and/or graphical representations of values indicative of fuel quantity, vehicle speed, coolant temperature, oil temperature, oil pressure, crankshaft rotation rate and/or other parameters associated with operation of the vehicle 10. In addition, the graphical display 34 may be configured to present two-dimensional or three-dimensional information associated with operation of the vehicle entertainment system, environmental control system, and/or navigational system (e.g., a moving map display). Similar to the gauges 30, a conductive interior trim component 36 is disposed about the graphical display 34. As discussed in detail below, the conductive interior trim components 32 and 36 are electrically coupled to a conductive structure (e.g., vehicle chassis) at a reference potential, thereby substantially reducing or eliminating electromagnetic interference associated with the conductive interior trim components 32 and 36. While an instrument panel 14 is described above, it should be appreciated that a conductive interior trim component having an electrical coupling to a conductive structure at a reference potential may be employed within alternative vehicle interior assemblies, such as center consoles 16, seats 18 and/or armrests 20, for example.

Figure 4:
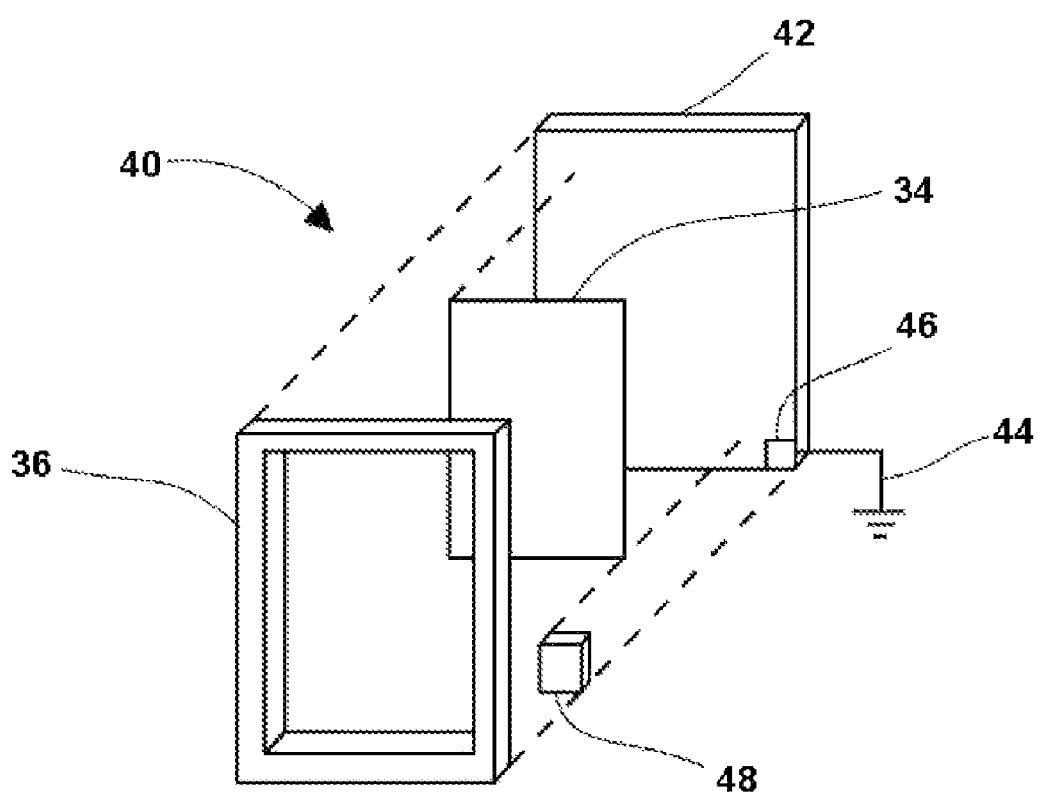
FIG. 4 is an exploded perspective view of an embodiment of a graphical display assembly including conductive foam configured to electrically couple a conductive interior trim component to a printed circuit board.

FIG. 4 is an exploded perspective view of an embodiment of a graphical display assembly 40 including conductive foam configured to electrically couple the conductive interior trim component 36 to a printed circuit board 42. In the illustrated embodiment, the printed circuit board 42 is positioned adjacent to the graphical display 34 and configured to drive the graphical display 34. For example, the printed circuit board 42 may include a graphics processor configured to convert signals indicative of vehicle parameters and/or navigational information into a graphical representation of the signals. In certain embodiments, the graphical display 34 may be communicatively coupled to the printed circuit board by a graphics interface. An RF signal produced by another electrical component within the vehicle 10 (e.g., switched-mode power supply, microprocessor, radio transmitter, etc.) may be absorbed and reradiated by the conductive interior trim component 36. As a result, the reradiated signal may generate electromagnetic interference within the graphics interface, thereby distorting an image on the graphical display 34. In addition, the conductive interior trim component 36 may reradiate electromagnetic energy produced by the graphics processor, or other source of RF radiation within the electronic sub-assembly 22, thereby inducing electromagnetic interference within other vehicle electrical components, such as sensors, radios, etc. In the present embodiment, the conductive interior trim component 36 is electrically coupled to a conductive structure at a reference potential, thereby substantially reducing or eliminating the ability of the conductive interior trim component 36 to reradiate electromagnetic energy. As a result, electromagnetic interference within the graphics interface and/or within other vehicle electrical components may be substantially reduced or eliminated.

In the illustrated embodiment, the interior trim component 36 is electrically coupled to the conductive structure at the reference potential via the printed circuit board 42. As illustrated, the graphical display assembly 40 includes an electrical conductor 44 extending between the printed circuit board 42 and the conductive structure. For example, the conductive structure may be a chassis of the vehicle 10. In such a configuration, the reference potential will be a "chassis ground" or "zero volt potential." Consequently, electromagnetic energy absorbed by the conductive interior trim component 36 will be substantially dissipated through the connection 44 to the conductive structure, thereby substantially reducing or eliminating reradiation which may otherwise result in electromagnetic inference with various electrical components within the vehicle 10.

In the illustrated embodiment, the printed circuit board 42 includes a contact 46 in electrical communication with the electrical conductor 44 extending to the conductive structure at the reference potential. For example, in certain embodiments, the contact 46 may be a copper region disposed on the surface of the printed circuit board 42. As illustrated, conductive foam 48 is compressed between the conductive interior trim component 36 and the contact 46, thereby establishing an electrical coupling between the conductive interior trim component 36 and the contact 46. Consequently, an electrical path will be established between the conductive interior trim component 36 and the structure at the reference potential. While conductive foam 48 is employed in the illustrated embodiment, it should be appreciated that alternative embodiments may utilize other structures to establish the electrical coupling between the conductive interior trim component 36 and the printed circuit board 42. Furthermore, while establishing an electrical connection between the graphical display trim component 36 and the printed circuit board 42 is described above, it should be appreciated that a substantially similar configuration may be employed to electrically couple the gauge trim component 32 to a respective printed circuit board.

In addition, while the illustrated embodiment includes a single electrical connection between the graphical display trim component 36 and the printed circuit board 42, it should be appreciated that alternative embodiments may include additional electrical connections. For example, the number of electrical connections may be dependent on the magnitude and/or the frequency of the electromagnetic interference. By way of example, certain graphical display assemblies 40 may include 1, 2, 3, 4, 5, 6, or more electrical connections. Moreover, the size of the contact 46 and the conductive foam 48 may vary based on the magnitude and/or the frequency of the electromagnetic interference. Consequently, electromagnetic energy absorbed by the conductive interior trim component 36 will be substantially dissipated through the connection or connections to the conductive structure, thereby substantially reducing or eliminating reradiation which may otherwise result in electromagnetic inference with various electrical components within the vehicle 10.

Figure 5:
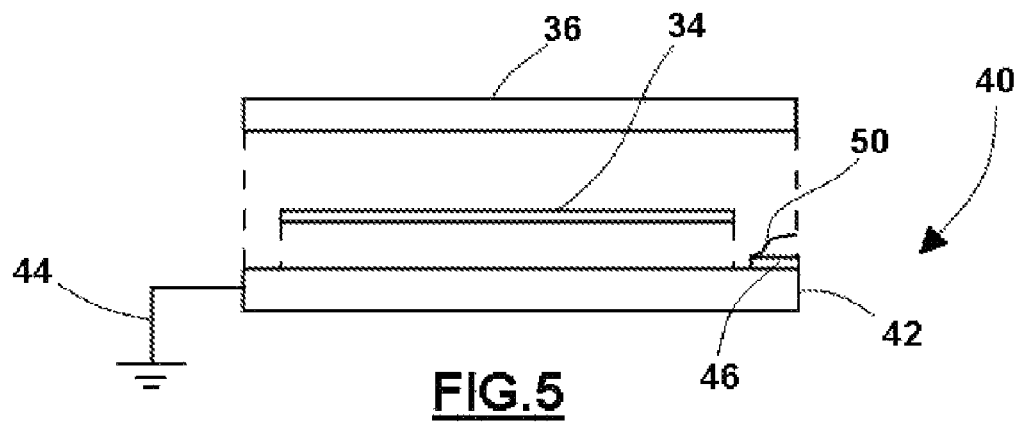
FIG. 5 is an exploded side view of an alternative embodiment of a graphical display assembly including a spring finger configured to electrically couple a conductive interior trim component to a printed circuit board.

FIG. 5 is an exploded side view of an alternative embodiment of a graphical display assembly 40 including a spring finger 50 configured to electrically couple the conductive interior trim component 36 to the printed circuit board 42. As illustrated, the spring finger 50 is electrically coupled to the contact 46 and extends above the surface of the printed circuit board 42. Coupling the conductive interior trim component 36 to the printed circuit board 42 will compress the spring finger 50, thereby establishing an electrical connection between the conductive interior trim component 36 and the contact 46. Similar to the configuration described above with reference to FIG. 4, the contact 46 is electrically coupled to the conductor 44 extending to the conductive structure at the reference potential. Consequently, the spring finger 50 will establish an electrical connection between the conductive interior trim component 36 and the conductive structure. While the spring finger 50 is employed in the illustrated embodiment, it should be appreciated that alternative embodiments may utilize other structures to establish the electrical coupling between the conductive interior trim component 36 and the printed circuit board 42. Furthermore, while establishing an electrical connection between the graphical display trim component 36 and the printed circuit board 42 is described above, it should be appreciated that a substantially similar configuration may be employed to electrically couple the gauge trim component 32 to a respective printed circuit board. In addition, while the illustrated embodiment includes a single spring finger 50, it should be appreciated that alternative embodiments may include additional spring fingers 50.

Figure 6:
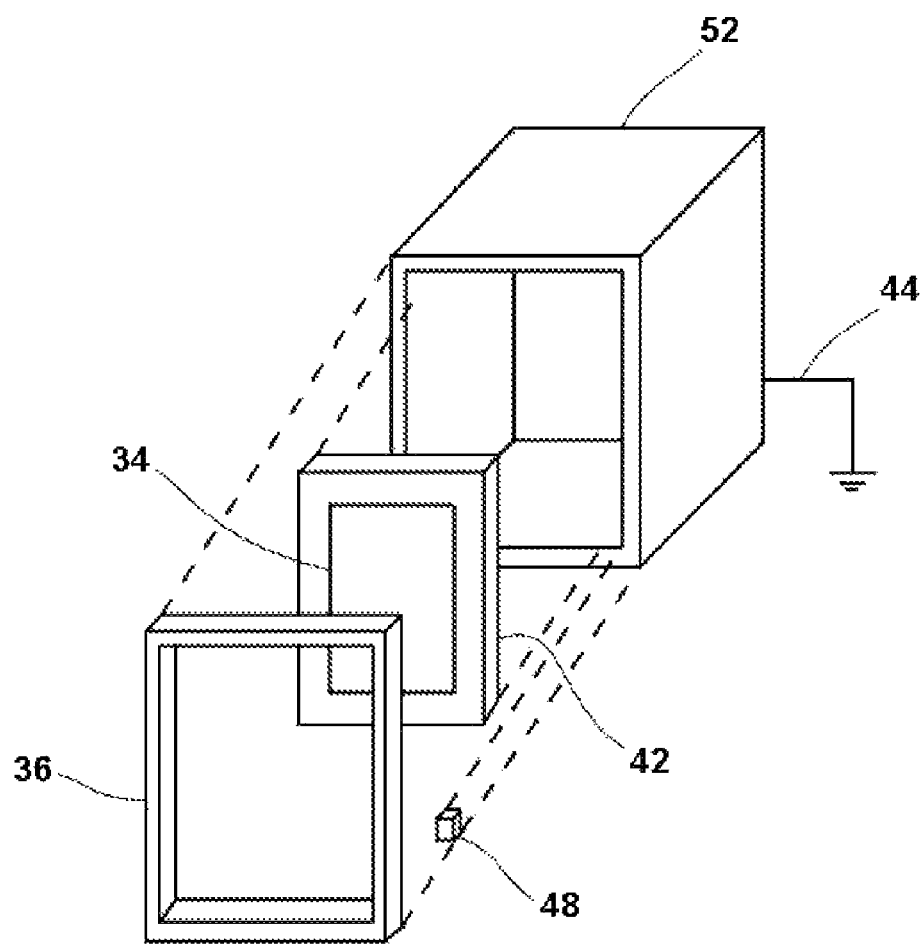
FIG. 6 is an exploded perspective view of another alternative embodiment of a graphical display assembly including conductive foam configured to electrically couple a conductive interior trim component to a housing.

FIG. 6 is an exploded perspective view of another alternative embodiment of a graphical display assembly including conductive foam 48 configured to electrically couple the conductive interior trim component 36 to a housing 52. In the illustrated embodiment, the housing 52 is configured to support the graphical display 34 within the instrument panel 14. In addition, the housing 52 is electrically coupled to the conductive structure at the reference potential by the electrical conductor 44. Consequently, the conductive foam 48 will establish an electrical connection between the conductive interior trim component 36 and the conductive structure. As a result, electromagnetic energy absorbed by the conductive interior trim component 36 will be substantially dissipated through the connection 44 to the conductive structure, thereby substantially reducing or eliminating reradiation which may otherwise result in electromagnetic inference with various electrical components within the vehicle 10. While conductive foam 48 is employed in the illustrated embodiment, it should be appreciated that alternative embodiments may utilize other structures to establish the electrical coupling between the conductive interior trim component 36 and the housing 52. In addition, while the illustrated embodiment includes a single electrical connection between the graphical display trim component 36 and the housing 52, it should be appreciated that alternative embodiments may include additional electrical connections. Furthermore, while establishing an electrical connection between the graphical display trim component 36 and the housing 52 is described above, it should be appreciated that a substantially similar configuration may be employed to electrically couple the gauge trim component 32 to a housing configured to support the electromechanical gauge 30. Moreover, while the conductive interior trim component 36 is electrically coupled to the conductive structure at the reference potential via the printed circuit board 42 or the housing 52 in certain embodiments described above, it should be appreciated that the conductive interior trim component 36 may be directly connected to the conductive structure, or connected to the conductive structure via other intermediate structures, in alternative embodiments.

Figure 7:
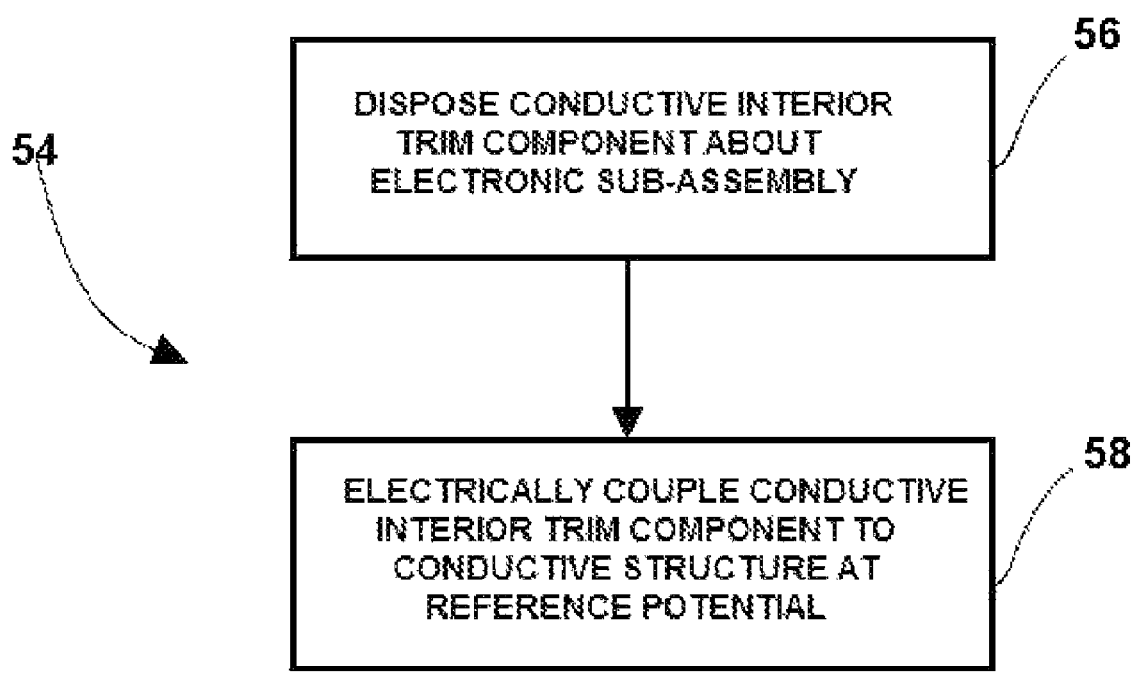
FIG. 7 is a flow diagram of an exemplary method for reducing electromagnetic interference from a conductive interior trim component.

FIG. 7 is a flow diagram of an exemplary method 54 for reducing electromagnetic interference from a conductive interior trim component. First, as represented by block 56, a conductive interior trim component is disposed about an electronic sub-assembly, such as an electromechanical gauge 30 or a graphical display 34. Next, the conductive interior trim component is electrically coupled to a conductive structure at a reference potential, as represented by block 58. For example, the conductive interior trim component may be electrically coupled to a chassis of the vehicle 10 at a chassis ground (e.g., zero volt) potential. In such a configuration, electromagnetic energy absorbed by the conductive interior trim component will be substantially dissipated through the connection to the conductive structure, thereby substantially reducing or eliminating reradiation which may otherwise result in electromagnetic inference with various electrical components within the vehicle 10.

While only certain features and embodiments of the invention have been illustrated and described, many modifications and changes may occur to those skilled in the art (e.g., variations in sizes, dimensions, structures, shapes and proportions of the various elements, values of parameters (e.g., temperatures, pressures, etc.), mounting arrangements, use of materials, colors, orientations, etc.) without materially departing from the novel teachings and advantages of the subject matter recited in the claims. The order or sequence of any process or method steps may be varied or re-sequenced according to alternative embodiments. It is, therefore, to be understood that the appended claims are intended to cover all such modifications and changes as fall within the true spirit of the invention. Furthermore, in an effort to provide a concise description of the exemplary embodiments, all features of an actual implementation may not have been described (i.e., those unrelated to the presently contemplated best mode of carrying out the invention, or those unrelated to enabling the claimed invention). It should be appreciated that in the development of any such actual implementation, as in any engineering or design project, numerous implementation specific decisions may be made. Such a development effort might be complex and time consuming, but would nevertheless be a routine undertaking of design, fabrication, and manufacture for those of ordinary skill having the benefit of this disclosure, without undue experimentation.

The invention claimed is:

1. A vehicle interior assembly, comprising:
    an electronic sub-assembly;
    a conductive interior trim component at least partially disposed about the electronic sub-assembly, wherein the conductive interior trim component is electrically coupled to a conductive structure at a reference potential.

2. The vehicle interior assembly of claim 1, wherein the electronic sub-assembly comprises a graphical display, an electromechanical gauge, or a combination thereof.

3. The vehicle interior assembly of claim 1, comprising a printed circuit board positioned adjacent to the electronic sub-assembly and configured to drive the electronic sub-assembly, wherein the printed circuit board is electrically coupled to the conductive structure at the reference potential.

4. The vehicle interior assembly of claim 3, wherein the conductive interior trim component is electrically coupled to the printed circuit board.

5. The vehicle interior assembly of claim 4, wherein the conductive interior trim component is electrically coupled to a contact on the printed circuit board by conductive foam.

6. The vehicle interior assembly of claim 4, wherein the conductive interior trim component is electrically coupled to a contact on the printed circuit board by a spring finger.

7. The vehicle interior assembly of claim 1, comprising a housing configured to support the electronic sub-assembly within the vehicle interior assembly, wherein the housing is electrically coupled to the conductive structure at the reference potential.

8. The vehicle interior assembly of claim 7, wherein the conductive interior trim component is electrically coupled to the housing.

9. The vehicle interior assembly of claim 1, wherein the conductive interior trim component comprises a ring having a metallic exterior surface.

10. A vehicle interior assembly, comprising:
    an electronic sub-assembly;
    a conductive interior trim component at least partially disposed about the electronic sub-assembly; and
    an electrical coupling extending between the conductive interior trim component and a conductive structure at a reference potential.

11. The vehicle interior assembly of claim 10, wherein the electrical coupling comprises conductive foam compressed between the conductive interior trim component and a printed circuit board, and the printed circuit board is electrically coupled to the conductive structure at the reference potential.

12. The vehicle interior assembly of claim 10, wherein the electrical coupling comprises a spring finger coupled to a printed circuit board and in contact with the conductive interior trim component, and the printed circuit board is electrically coupled to the conductive structure at the reference potential.

13. The vehicle interior assembly of claim 10, comprising a housing configured to support the electronic sub-assembly within the vehicle interior assembly, wherein the housing is electrically coupled to the conductive structure at the reference potential, and the conductive interior trim component is electrically coupled to the housing.

14. The vehicle interior assembly of claim 10, wherein the conductive interior trim component is positioned directly adjacent to the electronic sub-assembly.

15. A method for reducing electromagnetic interference from a conductive interior trim component, comprising:
    disposing the conductive interior trim component at least partially about an electronic sub-assembly within a vehicle interior assembly; and
    electrically coupling the conductive interior trim component to a conductive structure at a reference potential.

16. The method of claim 15, wherein electrically coupling the conductive interior trim component to the conductive structure comprises electrically coupling the conductive interior trim component to a printed circuit board positioned adjacent to the electronic sub-assembly, wherein the printed circuit board is electrically coupled to the conductive structure at the reference potential.

17. The method of claim 16, wherein electrically coupling the conductive interior trim component to the printed circuit board comprises electrically coupling the conductive interior trim component to a contact on the printed circuit board by conductive foam.

18. The method of claim 16, wherein electrically coupling the conductive interior trim component to the printed circuit board comprises electrically coupling the conductive interior trim component to a contact on the printed circuit board by a spring finger.

19. The method of claim 15, wherein electrically coupling the conductive interior trim component to the conductive structure comprises electrically coupling the conductive interior trim component to a housing configured to support the electronic sub-assembly within the vehicle interior assembly, wherein the housing is electrically coupled to the conductive structure at the reference potential.

20. The method of claim 15, wherein the conductive interior trim component comprises a ring having a metallic exterior surface.

* * * * *